(12) United States Patent
Park

(10) Patent No.: US 11,988,719 B2
(45) Date of Patent: May 21, 2024

(54) SYSTEM FOR ESTIMATING STATE OF HEALTH OF BATTERY USING BIG DATA

(71) Applicants: Hyundai Motor Company, Seoul (KR); Kia Motors Corporation, Seoul (KR)

(72) Inventor: Hyun Soo Park, Whasung-Si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 836 days.

(21) Appl. No.: 17/027,055

(22) Filed: Sep. 21, 2020

(65) Prior Publication Data

US 2021/0349156 A1 Nov. 11, 2021

(30) Foreign Application Priority Data

May 8, 2020 (KR) .......................... 10-2020-0054826

(51) Int. Cl.
*G01R 31/392* (2019.01)
*B60L 58/16* (2019.01)
*G01R 31/367* (2019.01)
(52) U.S. Cl.
CPC ......... *G01R 31/392* (2019.01); *G01R 31/367* (2019.01); *B60L 58/16* (2019.02)
(58) Field of Classification Search
CPC ............................ G01R 31/367; G01R 31/392; G01R 31/3835; G01R 31/3644; G06Q 10/06; G06Q 50/30; B60W 20/15
See application file for complete search history.

(56) References Cited

U.S. PATENT DOCUMENTS

| 5,487,002 | A |  | 1/1996 | Diller et al. |
| 10,031,188 | B2 | * | 7/2018 | Lee ..................... G01R 31/3835 |
| 11,445,362 | B2 |  | 9/2022 | Liu et al. |
| 2005/0274553 | A1 |  | 12/2005 | Salman et al. |
| 2013/0030630 | A1 |  | 1/2013 | Luke et al. |
| 2013/0073507 | A1 |  | 3/2013 | Sera |

(Continued)

FOREIGN PATENT DOCUMENTS

| CN | 112349975 A |  | 2/2021 |  |
| EP | 1604341 B1 | * | 4/2008 | ......... G01R 31/3644 |

(Continued)

OTHER PUBLICATIONS

M. A. Salahuddin, A. Al-Fuqaha and M. Guizani, "Software-Defined Networking for RSU Clouds in Support of the Internet of Vehicles," in IEEE Internet of Things Journal, vol. 2, No. 2, pp. 133-144, Apr. 2015, doi: 10.1109/JIOT.2014.2368356.

(Continued)

*Primary Examiner* — Yuri Kan
(74) *Attorney, Agent, or Firm* — MORGAN, LEWIS & BOCKIUS LLP

(57) ABSTRACT

A system for estimating a state of health (SOH) of a battery using big data, may include a big data server receiving vehicle driving-related data generated from a vehicle and a result of determining the SOH of the battery, processing the received vehicle driving-related data, and generating and storing a factor related to the SOH of the battery mounted in the vehicle; and a controller mounted in the vehicle and determining the SOH of the battery referring to the factor stored in the big data server.

11 Claims, 2 Drawing Sheets

(56) References Cited

U.S. PATENT DOCUMENTS

| | | |
|---|---|---|
| 2014/0236403 A1 | 8/2014 | Liu et al. |
| 2015/0120225 A1* | 4/2015 | Kim .................. G01R 31/392 |
| | | 702/63 |
| 2016/0202323 A1* | 7/2016 | Lee .................. G01R 31/392 |
| | | 324/433 |
| 2016/0297416 A1 | 10/2016 | Geller |
| 2017/0067750 A1 | 3/2017 | Day et al. |
| 2018/0056807 A1* | 3/2018 | Park .................. B60W 20/15 |
| 2018/0123185 A1* | 5/2018 | Kim .................. G01R 31/392 |
| 2018/0257473 A1 | 9/2018 | Follen et al. |
| 2018/0329935 A1 | 11/2018 | Mugali et al. |
| 2019/0132709 A1 | 5/2019 | Graefe et al. |
| 2020/0013244 A1 | 1/2020 | Rosenbaum |
| 2020/0070679 A1 | 3/2020 | Wang et al. |
| 2020/0077240 A1 | 3/2020 | Bansal et al. |
| 2020/0092396 A1 | 3/2020 | Wu et al. |
| 2020/0127980 A1 | 4/2020 | Smith et al. |
| 2020/0137351 A1 | 4/2020 | Bai et al. |
| 2020/0307621 A1 | 10/2020 | Ostrowski et al. |
| 2021/0094435 A1 | 4/2021 | Rechkemmer et al. |
| 2021/0175732 A1 | 6/2021 | Matsuda et al. |
| 2022/0026492 A1* | 1/2022 | Verheijen .............. G01R 31/392 |
| 2022/0109726 A1 | 4/2022 | Katata et al. |
| 2022/0266719 A1* | 8/2022 | Iida .................. G06Q 50/30 |
| 2022/0281345 A1* | 9/2022 | Kim .................. G06Q 10/06 |
| 2023/0105038 A1 | 4/2023 | Liu et al. |

FOREIGN PATENT DOCUMENTS

| | | |
|---|---|---|
| KR | 10-2015-0042566 A | 4/2015 |
| KR | 10-2018-0116914 A | 10/2018 |
| KR | 10-2019-0100114 A | 8/2019 |
| KR | 10-2019-0122298 A | 10/2019 |
| KR | 10-2020-0040576 A | 4/2020 |
| WO | WO 2019/196094 A1 | 10/2019 |

OTHER PUBLICATIONS

M. Shengdong, X. Zhengxian and T. Yixiang, "Intelligent Traffic Control System Based on Cloud Computing and Big Data Mining," in IEEE Transactions on Industrial Informatics, vol. 15, No. 12, pp. 6583-6592, Dec. 2019, doi: 10.1109/TII.2019.2929060.

W. Menghua and X. Bing, "A Real-Time Android-Based Monitoring System for the Power Lithium-Ion Battery Used on EVs," 2017 10th International Conference on Intelligent Computation Technology and Automation (ICICTA), 2017, pp. 245-249, doi: 10.1109/ICICTA.2017.62.

Farmann, et al., "A comprehensive review of on-board State-of-Available-Power prediction techniques for lithium-ion batteries in electric vehicles," *Journal of Power Sources*, 329:123-137 (2016).

Taylor, Christine, "Home a Big Data Jun. 8, 2017", *Big Data Architecture/Datamation*, pp. 1-9, Apr. 21, 2021;12:32.

European Extended Search Report, Appl. No. EP 20206929.0-1205, dated May 7, 2021.

European Extended Search Report, Appl. No. EP 20208946.2-1203, dated Jun. 2, 2021.

\* cited by examiner

SYSTEM FOR ESTIMATING STATE OF HEALTH OF BATTERY USING BIG DATA

CROSS REFERENCE TO RELATED APPLICATION

The present application claims priority to Korean Patent Application No. 10-2020-0054826, filed May 8, 2020, the entire contents of which is incorporated herein for all purposes by this reference.

BACKGROUND OF THE INVENTION

Field of the Invention

The present invention relates to a system for estimating a state of health (SOH) of a battery using big data, and more particularly, to a system for estimating an SOH of a vehicle using big data capable of estimating the SOH of the battery in the vehicle regardless of a specific state or condition of the vehicle using the big data constructed through a big data server.

Description of Related Art

In general, a high-voltage battery storing electrical energy provided to a driving motor of an eco vehicle deteriorates over time, and its state of health (SOH) decreases. Especially, the battery has a variation in degree to which the SOH decreases depending on vehicle driving environments or driver's driving characteristics.

To estimate the SOH of the battery, an SOH estimating calculation has conventionally been performed only when the vehicle enters a specific mode. For example, the SOH estimating calculation has been performed only when the vehicle is in a low-speed battery charging mode. Furthermore, although the mode of the vehicle is satisfied, the SOH estimating calculation could be done only when various conditions, such as a condition for entry to a calculation of an SOH and a condition for determination according to battery voltage behavior, are satisfied.

Due to the limits of conventional SOH estimating techniques even after a lot of such techniques have been generated, there are some vehicles in which a calculation of an SOH is not performed because the aforementioned mode or condition is not satisfied.

The information included in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a system for estimating a state of health (SOH) of a battery using big data configured for estimating the SOH of the battery in a vehicle regardless of a specific state or condition of the vehicle using the big data constructed through a big data server.

According to various exemplary embodiments of the present invention, a system for estimating a state of health (SOH) of a battery using big data includes: a big data server receiving vehicle driving-related data generated from a vehicle and a result of calculating the SOH of the battery, processing the received vehicle driving-related data, and generating and storing a factor related to the SOH of the battery mounted in the vehicle; and a controller disposed in the vehicle and calculating the SOH of the battery referring to the factor stored in the big data server.

The big data server may group vehicles having similarity based on the factor and generates information on the SOH of the battery for each group.

The big data server may include cloud servers in a plurality of layers, the cloud servers including: a lower-layer cloud server having a layer lower than a predetermined layer, directly receiving the vehicle driving-related data from the vehicle and sorting the data for use in calculating the factor related to the SOH of the battery; and an upper-layer cloud server having a layer higher than the predetermined layer, receiving the sorted data from the lower-layer cloud server, processing the sorted data, generating the factor related to the SOH of the battery, and grouping the vehicles having similarity to each other based on the generated factor related to the SOH of the battery.

When the vehicle is in a state where a preset condition for calculating the SOH of the battery is satisfied, the controller may calculate the SOH of the battery using a preset algorithm for calculating the SOH of the battery and determine whether the calculated SOH of the battery is appropriate based on the information on the SOH of the battery for a group to which the vehicle belongs.

When the calculated SOH of the battery is a value between a maximum SOH value of the battery and a minimum SOH value of the battery in the group to which the vehicle belongs, the controller may determine the calculated SOH of the battery to be a final SOH of the battery.

When the vehicle is not in a state where a preset condition for calculating the SOH of the battery is satisfied, the controller may calculate the SOH of the battery by combining a previously calculated SOH of the battery and the information on the SOH of the battery in a group to which the vehicle belongs.

When the vehicle is not in the state where the preset condition for calculating the SOH of the battery is satisfied, the controller may calculate the SOH of the battery by combining the previously calculated SOH of the battery and a representative SOH value of the battery in the group to which the vehicle belongs after respective weight values are assigned thereto.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
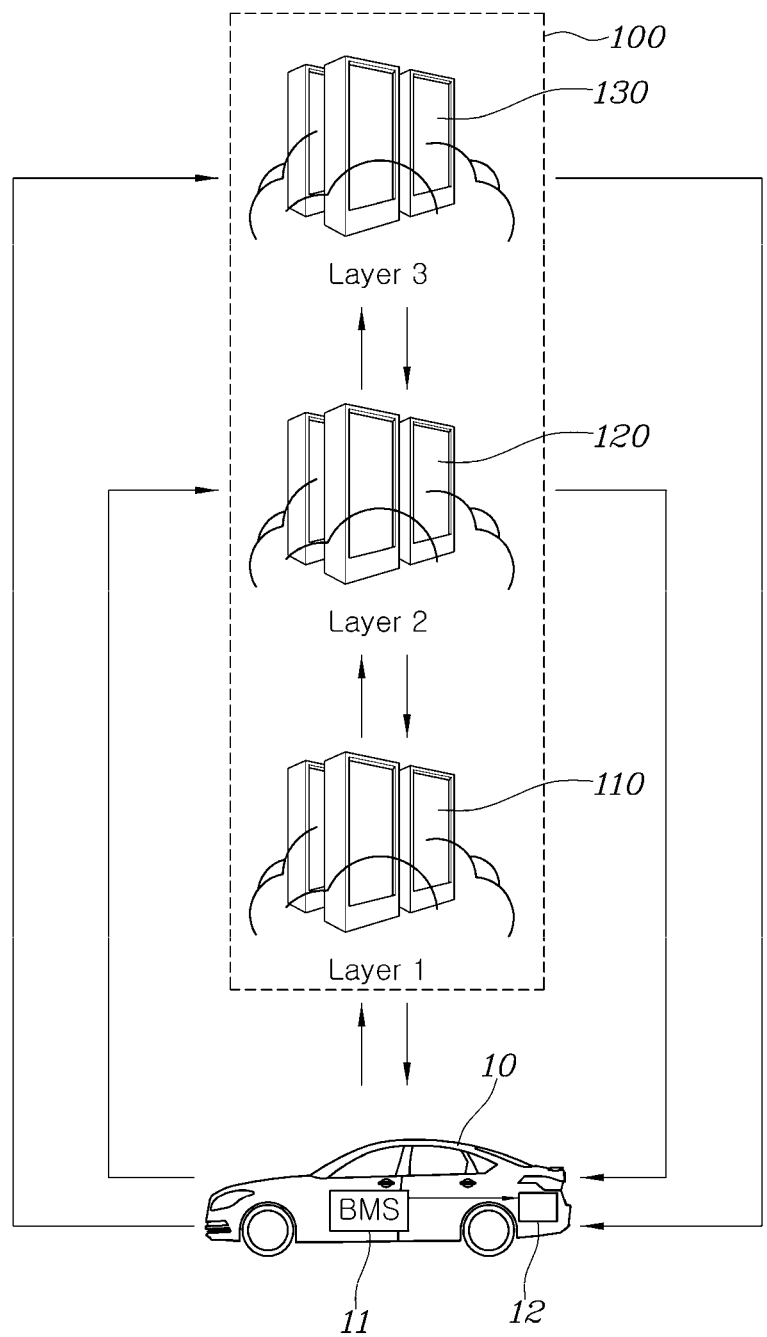
FIG. 1 is a schematic diagram illustrating a system for estimating a state of health of a battery using big data according to various exemplary embodiments of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, a system for estimating a state of health (SOH) of a battery using big data according to various embodiments of the present invention will be described in detail with reference to the accompanying drawings.

FIG. 1 is a schematic diagram illustrating a system for estimating an SOH of a battery using big data according to various exemplary embodiments of the present invention.

Referring to FIG. 1, the system for estimating an SOH of a battery using big data according to various exemplary embodiments of the present invention may include: a big data server 100 receiving vehicle driving-related data generated from a vehicle 10, processing the received vehicle driving-related data, and generating and storing a factor related to an SOH of the battery mounted in the vehicle 10; and a controller 11 disposed in the vehicle 10 and calculating the SOH of the battery referring to the factor stored in the big data server 100.

The big data server 100 may receive various types of data generated from the vehicle 10 while the vehicle is in operation, process the received data, and generate and store analyzed data. The big data server 100 may generate and store a factor related to the SOH of the battery based on the data received from the vehicle or secondary data generated using the data received from the vehicle.

As illustrated in FIG. 1, the big data server 100 may be implemented in a distributed cloud type in a layered structure having cloud servers 110, 120, and 130 in respective layers.

For example, a first-layer cloud server 110, which belongs to the lowest layer in the multi-layer structure, may log data generated from the vehicle 10 in real time in communication with the vehicle 10 and provide the logged data to the vehicle 10 or to the cloud server 120 or 130, which belongs to a layer higher than the lowest layer 110, if necessary.

The first-layer cloud server 110 may log raw data generated from the vehicle in real time by communicating with the vehicle. The first-layer cloud server 110 may log and store vehicle data without data loss at a sampling rate as short as possible. Furthermore, the first-layer cloud server 110 may set a restriction on the number of data which may be logged and stored per communicating vehicle. Of course, all data logged from the vehicle may be stored if resources permit. However, since the first-layer cloud server 110 communicates with the vehicle mostly in real time to control the vehicle, it is preferable to restrict the number of data which may be stored per vehicle to efficiently use the resources.

The raw data logged by the first-layer cloud server 110 may be data generated and transmitted from various controllers of the vehicle, e.g., a temperature, a voltage, and an SOC value of a battery in the vehicle 10, an rpm, a voltage, and a temperature of a motor, a vehicle speed, an outdoor temperature, and an rpm of an engine.

In various exemplary embodiments of the present invention for calculating an SOH of a battery, the first-layer cloud server 110 may directly receive various kinds of driving-related data from the vehicle 10, and sort the data for use in calculating the factor related to the SOH of the battery 12. The real-time data provided from the vehicle 10 to the first-layer cloud server 110 may be data related to the battery 12 mounted in the vehicle, e.g., whether or not the battery 12 is in a charged state or in a discharged state, a real-time current of the battery 12, a real-time voltage of the battery 12, a real-time state of charge (SOC) value of the battery 12, a current mileage, a vehicle speed, an instantaneous power of the battery 12 calculated by the controller 11, and an SOH of the battery 12 calculated by the controller 11.

The cloud servers 120 and 130, which belong to higher layers than the first-layer cloud server 110, may process and store data provided by the first-layer cloud server 110 and transmit the processed data to the vehicle 10 in communication with the vehicle 10. FIG. 1 is for exemplarily describing an exemplary embodiment implemented in a total of three layers, and the number of layers may be appropriately adjusted as required.

For example, the second-layer cloud server 120 may primarily process the raw data logged by the first-layer cloud server 110 and calculate and store items such as average, maximum/minimum, RMS, and standard deviation values. The processed data may be stored and managed in a form of a preset data set. The data stored in the second-layer cloud server 120 may be stored in a form of data processed in a predetermined format, not raw data, along with a date of the data or a driving time, a vehicle identifier, and the like.

The first-layer cloud server 110 immediately stores collected raw data, whereas the second-layer cloud server 120, which processes data collected from the first-layer cloud server 110, is not necessarily required to process and store raw data in real time, with some delay time permitted in processing and storing data after acquiring the data.

In various embodiments of the present invention for calculating an SOH of a battery, data processed and calculated by the second-layer cloud server 120 may be factors related to the SOH of the battery. The factors related to the SOH of the battery may be an accumulated charge amount, an accumulated discharge amount, and the number of times of high-speed/low-speed charging of the battery 12, an average temperature of the battery 12, a maximum temperature of the battery 12, an amount of current used by the battery 12, an internal resistance of the battery 12, a time for which the battery 12 is charged, a mileage of the vehicle, and the like.

The vehicle 10 may request the second-layer cloud server 120 for processed data, when required, and receive the processed data.

Furthermore, the third-layer cloud server 130 may secondarily process data processed by the second-layer cloud server 120, that is, the factor related to the SOH of the battery. The third-layer cloud server 130 may perform data processing that requires a higher-level calculation ability than that required by the second-layer cloud server 120 for data processing.

The third-layer cloud server 130 may group each vehicle based on the factor related to the SOH of the battery provided by the second-layer cloud server 120. That is, the third-layer cloud server 130 may group vehicles on the basis of similarity in the factor related to the SOH of the battery. For example, the third-layer cloud server 130 may group, into the same group, vehicles having similarity in an accumulated charge amount, an accumulated discharge amount, and the number of times of high-speed/low-speed charging of the battery 12, an average temperature of the battery 12, a maximum temperature of the battery 12, an amount of current used by the battery 12, an internal resistance of the battery 12, a time for which the battery 12 is charged, a mileage of the vehicle, or the like, and generate and store information on the SOH calculated from the plurality of vehicles belonging to the group. The information on the SOH of the battery calculated for each group may be a maximum SOH value of the battery, a minimum SOH value of the battery, and a representative SOH value of the battery among the vehicles belonging to the group, and the like. Here, the representative SOH value of the battery may be a value obtained by simply averaging out SOHs of batteries of the vehicles belonging to the group or produced by use of various known data analysis techniques for producing a representative value.

The controller 11 disposed in the vehicle 10 may determine whether a condition for calculating the SOH of the battery 12 is satisfied, and calculate the SOH of the battery 12 using data provided by the big data server 100 in an appropriate manner depending on whether or not the condition is satisfied.

When various exemplary embodiments of the present invention is implemented in an actual vehicle, the controller 11, which needs to perform various operations to calculate the SOH of the battery 12, may be a battery management system (BMS) performing control related to the battery 12, and the battery 12 may be a high-voltage battery supplying power for driving a motor that provides power to driving wheels of the vehicle.

The specific operations of the system for estimating an SOH of a battery using big data according to various embodiments of the present invention configured as described above will be described below.

Figure 2:
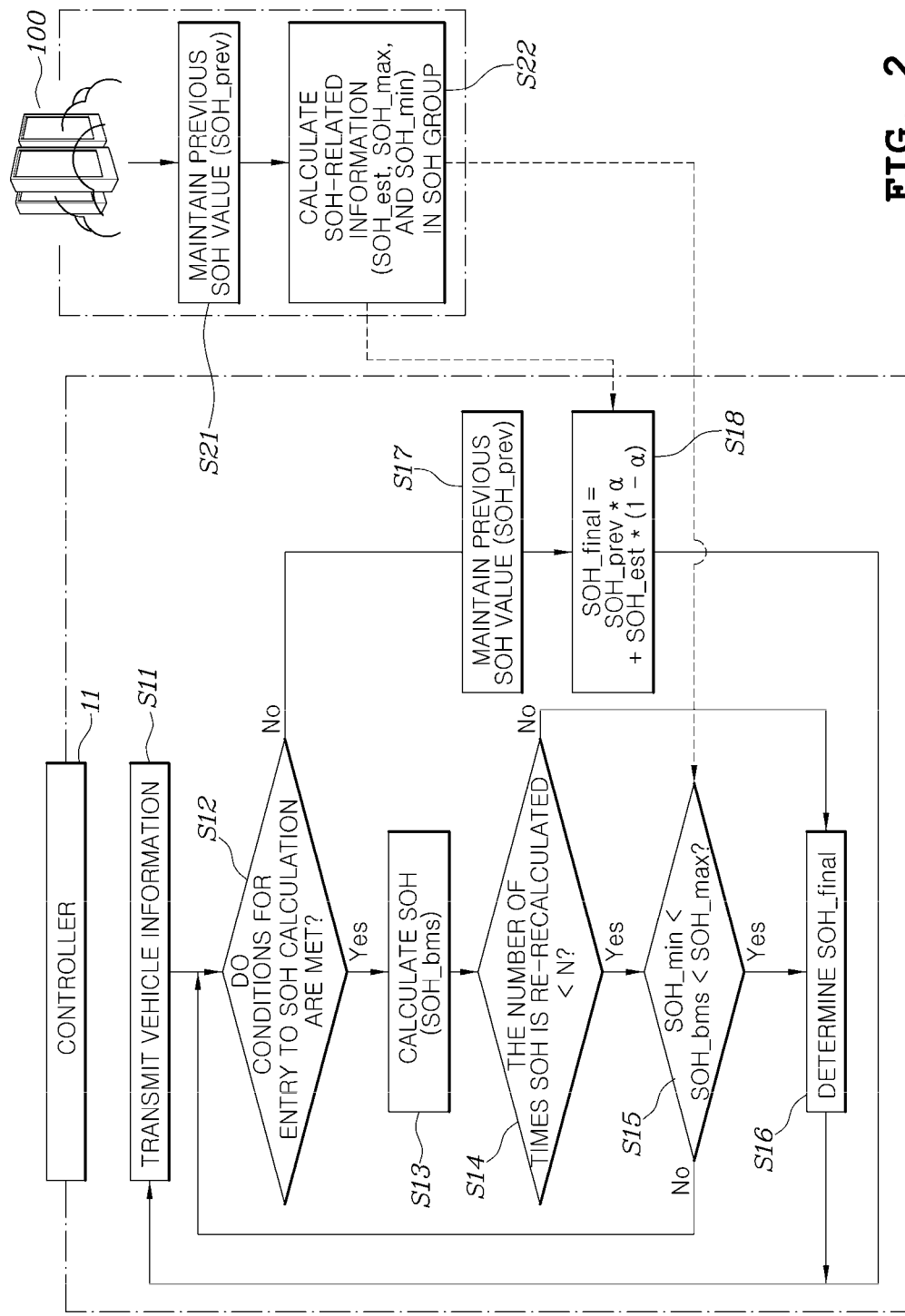
FIG. 2 is a flowchart illustrating the system for estimating a state of health of a battery using big data according to various exemplary embodiments of the present invention.

FIG. 2 is a flowchart illustrating the system for estimating an SOH of a battery using big data according to various exemplary embodiments of the present invention.

The operations as illustrated in FIG. 2 may be performed by the controller 11 of the vehicle 10 and the big data server 100.

Referring to FIG. 2, the vehicle 10 may provide vehicle driving-related data to the big data server 100 at preset time intervals in a powered-on state (S11). The big data server 100 may process vehicle driving-related data received from a plurality of vehicles and group each of the vehicles based on the factor related to the SOH of the battery (S21). In step S21, it may be determined what group the vehicle 10 providing the data to the big data server 100 belongs to.

Subsequently, the big data server 100 may calculate information related to the SOH of the battery among vehicles belonging to each group, into which the vehicles are grouped in step S21 (S22). In step S22, the big data server 100 may calculate a maximum SOH value of the battery, a minimum SOH value of the battery, and a representative SOH value among the vehicles belonging to each group.

Meanwhile, the controller 11 of the vehicle 10 may check whether the condition for calculating the SOH of the battery is satisfied using an algorithm for calculating the SOH of the battery stored therein (S12). The checking (S12) of whether the condition for calculating the SOH of the battery is satisfied using the algorithm for calculating the SOH of the battery stored therein may be performed at every preset time interval in a state where the vehicle is powered on or performed whenever the vehicle is in a specific driving state (e.g., when the vehicle remains in a charged state or in a stationary state for a predetermined time period or more). Concerning the specific condition for calculating the SOH of the battery, each vehicle manufacturer may apply its own unique techniques.

In S12, when it is determined that the condition for calculating the SOH of the battery is satisfied, the controller 11 may calculate a state of health (SOH_bms) of the battery using a pre-stored algorithm for calculating the SOH of the battery. For the algorithm for calculating the SOH of the battery, one of the various techniques known in the related art may be selectively used, and each manufacturer may set the algorithm differently. For example, there are known algorithms for calculating an SOH of a battery based on whether a battery capacity is increased by charging the battery or decreased by discharging the battery while the vehicle is driving.

Subsequently, when the number of times the state of health (SOH_bms) of the battery is recalculated is smaller than a predetermined reference value N (S14), the controller 11 receives information related to the SOH of the battery from the big data server 100 and compares the received information with the calculated state of health (SOH_bms) of the battery (S15). Here, the information related to the SOH of the battery received from the big data server 100 may be a maximum SOH value (SOH_max) of the battery and a minimum SOH value (SOH_min) of the battery in a group to which a relevant vehicle belongs.

In step S15, when it is determined that the state of health (SOH_bms) of the battery calculated by the controller 11 is a value between the maximum SOH value (SOH_max) of the battery and the minimum SOH value (SOH_min) of the battery received from the big data server 100, the controller 11 may determine the state of health (SOH_bms) of the battery calculated by itself to be a final state of health (SOH_final) of the battery 12 (S16).

In step S15, when it is not determined that the state of health (SOH_bms) of the battery calculated by the controller 11 is a value between the maximum SOH value (SOH_max) of the battery and the minimum SOH value (SOH_min) of the battery received from the big data server 100, the controller 11 may store the state of health (SOH_bms) of the battery calculated by itself and recalculate an SOH of the battery.

In step S14, when the SOH of the battery calculated based on step S15 is determined as the same value in a preset number of times N or more, the controller 11 may determine it as the final state of health (SOH_final) of the battery 12 (S16) without going through step S15.

As described above, after it is determined whether the SOH of the battery calculated by the controller 11 is appropriate by comparing the calculated SOH of the battery with the information related to the SOH of the battery in a group to which a vehicle belongs, when the calculated SOH of the battery is not determined to be appropriate, the controller 11 defers a decision about a final SOH of the battery and recalculates an SOH of the battery multiple times. If the same value is continuously derived through the multiple calculations, it may be determined as the final SOH of the battery and the determined final SOH of the battery may be provided to the big data server 100.

In an exemplary embodiment of the present invention, the SOH of the battery calculated by the controller 11 is appropriate if the SOH of the battery is in a predetermined range.

Meanwhile, in step S12, when the condition for calculating the SOH of the battery is not satisfied, the controller 11 may maintain a previously calculated and decided SOH (SOH_prev) of the battery (S17), and determine a final state of health (SOH_final) of the battery by adding upwards the previously SOH (SOH_prev) of the battery and the representative SOH value (SOH_est) of the battery provided by the big data server 100 after respective weight values a are assigned thereto.

Here, the weight value a may be a value between 0 and 1 and appropriately changed reflecting a data reliability of the big data server 100 which may be determined depending on the number of data collected by the big data server 100, the number of vehicles belonging to a group, or the like. For example, when the number of data on SOHs of vehicles collected for each group is very small, that is, when there is no reliably sufficient data collected in the big data server 100, the weight value a may be decided to be 1. When the weight value a is decided to be 1, the SOH of the vehicle calculated in step S18 does not reflect the representative SOH value (SOH_est) of the battery provided by the big data server 100, which has a low reliability. The more reliable the big data server 100 is by collecting sufficient data therein and increasing the number of data, the smaller the weight value a may be set.

As described above, the system for estimating an SOH of a battery using big data according to various exemplary embodiments of the present invention is configured for calculating an SOH of a battery in the vehicle at a desired time regardless of a state of the vehicle, that is, whether or not the preset condition for calculating the SOH of the battery is entered.

The system for estimating an SOH of a battery using big data according to various exemplary embodiments of the present invention is configured for utilizing information related to the SOH of the battery derived through a lot of data obtained from vehicles belonging to a group having similar battery-related information, improving a reliability in estimating the SOH of the battery.

In an exemplary embodiment of the present invention, the system for estimating an SOH of a battery using big data may display the estimated SOH of the battery in a display device or provide the information of the estimated SOH of the battery to driver's mobile device or a canner for a vehicle including the battery.

The effects obtainable from the present invention are not limited to the above-mentioned ones, and other non-mentioned effects may be clearly understood from the description above by those having ordinary knowledge in the field of technology to which various exemplary embodiments of the present invention pertains.

Furthermore, the term "controller" refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present invention. The controller according to exemplary embodiments of the present invention may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors.

The controller may be at least one microprocessor operated by a predetermined program which may include a series of commands for carrying out a method in accordance with various exemplary embodiments of the present invention.

The aforementioned invention can also be embodied as computer readable codes on a computer readable recording medium. The computer readable recording medium is any data storage device that can store data which may be thereafter read by a computer system. Examples of the computer readable recording medium include hard disk drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet).

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A system for estimating a state of health (SOH) of a battery using big data, the system comprising:
  a big data server including a processor, the processor being configured to receive vehicle driving-related data generated from a vehicle and a result of determining the SOH of the battery, to process the received vehicle driving-related data, and to generate and store a factor related to the SOH of the battery mounted in the vehicle;
  a controller disposed in the vehicle and configured for determining the SOH of the battery using a preset algorithm for determining the SOH of the battery based on the factor stored in the big data server and outputting the determined SOH,
  wherein the processor is configured to group vehicles having similarity according to the factor and generate information on the SOH of the battery for each group,
  wherein the controller is configured to determine whether the determined SOH of the battery is appropriate based on the information on the SOH of the battery for a group to which the vehicle belongs,
  wherein the information on the SOH of the battery for each group comprises a maximum SOH value of the battery, a minimum SOH value of the battery and a representative SOH value of the battery, and wherein when the vehicle is in a state in which a preset condition for determining the SOH of the battery is satisfied, and the determined SOH of the battery is a value between the maximum SOH value of the battery and the minimum SOH value of the battery in the group to which the vehicle belongs, the controller is configured to determine the determined SOH of the battery to be a final SOH of the battery and to control the battery based on the determined SOH to provide power to a motor of the vehicle to drive wheels of the vehicle.

2. The system of claim 1, wherein the big data server includes cloud servers in a plurality of layers, the cloud servers including:

a lower-layer cloud server having a layer lower than a predetermined layer, and including a lower-layer processor directly configured for receiving the vehicle driving-related data from the vehicle and sorting the vehicle driving-related data for use in determining the factor related to the SOH of the battery; and an upper-layer cloud server having a layer higher than the predetermined layer, and including a upper-layer processor configured for receiving the sorted vehicle driving-related data from the lower-layer cloud server, for processing the sorted vehicle driving-related data, for generating the factor related to the SOH of the battery, and for grouping the vehicles having similarity to each other according to the generated factor related to the SOH of the battery.

3. The system of claim 1, wherein when the vehicle is not in a state in which a preset condition for determining the SOH of the battery is satisfied, the controller is configured to determine the SOH of the battery by combining a previously determined SOH of the battery and information on the SOH of the battery in the group to which the vehicle belongs.

4. The system of claim 1, wherein when the vehicle is not in a state in which a preset condition for determining the SOH of the battery is satisfied, the controller is configured to determine the SOH of the battery by combining a previously determined SOH of the battery and the representative SOH value of the battery in the group to which the vehicle belongs after respective weight values are assigned thereto.

5. A method for estimating a state of health (SOH) of a battery using big data, the method comprising:

providing, by a controller of a vehicle, vehicle driving-related data to the big data server at preset time intervals when the vehicle is in a powered-on state;

processing, by a processor of the big data server, vehicle driving-related data received from a plurality of vehicles, and generating and storing a factor related to the SOH of the battery mounted in the vehicle;

grouping, by the processor, each of the plurality of vehicles based on similarity of the factor related to the SOH of the battery;

determining, by the processor, information related to the SOH of the battery among the plurality of vehicles belonging to each group, into which the plurality of vehicles are grouped;

determining, by the controller, the SOH of the battery using a preset algorithm for determining the SOH of the battery based on the factor and outputting the determined SOH; and wherein the controller is configured for determining whether the determined SOH of the battery is appropriate based on the information on the SOH of the battery for a group to which the vehicle belongs, wherein the information on the SOH of the battery for each group comprises a maximum SOH value of the battery, a minimum SOH value of the battery and a representative SOH value of the battery, and wherein upon determining that the state of health of the battery determined by the controller is a value between the maximum SOH value of the battery and the minimum SOH value of the battery received from the big data server, the controller is configured to determine the state of health of the battery determined by the controller to be a final state of health of the battery and to control the battery based on the determined SOH to provide power to a motor of the vehicle to drive wheels of the vehicle.

6. The method of claim 5, further including checking, by the controller, whether a condition for determining the SOH of the battery is satisfied at every preset time interval when the vehicle is powered on or when the vehicle is in a predetermined driving state.

7. The method of claim 6, wherein the predetermined driving state is a state in which the vehicle remains in a charged state or in a stationary state for a predetermined time period or more.

8. The method of claim 5, wherein when a number of times the state of health of the battery is re-determined is smaller than a predetermined reference value, the controller is configured to receive the maximum SOH value of the battery and the minimum SOH value of the battery in a group to which a relevant vehicle belongs from the big data server and to compare the received information with the determined state of health of the battery.

9. The method of claim 8, wherein upon determining that the SOH of the battery determined by the controller is not equal to a value between the maximum SOH value of the battery and the minimum SOH value of the battery received from the big data server, the controller is configured to store the SOH of the battery determined by the controller and re-determine the SOH of the battery.

10. The method of claim 8, wherein when the SOH of the battery is determined as a same value in a preset number of times or more, the controller is configured to determine the SOH of the battery as a final state of health of the battery.

11. The method of claim 6, wherein when the condition for determining the SOH of the battery is not satisfied, the controller is configured to maintain a previously determined SOH of the battery, and to determine a final state of health of the battery by adding upwards the previously SOH of the battery and a representative SOH value of the battery provided by the big data server after respective weight values are assigned thereto.

* * * * *